US009373499B2

(12) United States Patent
Toyoda et al.

(10) Patent No.: US 9,373,499 B2
(45) Date of Patent: Jun. 21, 2016

(54) BATCH-TYPE REMOTE PLASMA PROCESSING APPARATUS

(71) Applicant: Hitachi Kokusai Electric Inc., Nakano-ku, Tokyo (JP)

(72) Inventors: Kazuyuki Toyoda, Nakano-ku (JP); Yasuhiro Inokuchi, Nakano-ku (JP); Motonari Takebayashi, Nakano-ku (JP); Tadashi Kontani, Nakano-ku (JP); Nobuo Ishimaru, Nakano-ku (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/690,936

(22) Filed: Apr. 20, 2015

(65) Prior Publication Data

US 2015/0228476 A1 Aug. 13, 2015

Related U.S. Application Data

(60) Continuation of application No. 13/674,753, filed on Nov. 12, 2012, now Pat. No. 9,039,912, which is a division of application No. 11/932,502, filed on Oct. 31, 2007, now abandoned, which is a continuation of (Continued)

(30) Foreign Application Priority Data

Jan. 10, 2002 (JP) ................................. 2002-003615
Jul. 12, 2002 (JP) ................................. 2002-203397

(51) Int. Cl.
*B44C 1/22* (2006.01)
*C03C 25/68* (2006.01)

(Continued)

(52) U.S. Cl.
CPC ........ *H01L 21/02274* (2013.01); *C23C 16/452* (2013.01); *C23C 16/4583* (2013.01);

(Continued)

(58) Field of Classification Search
CPC .......................... H01L 21/02274; H01L 21/77
USPC ..................................................... 216/67, 71
See application file for complete search history.

(56) References Cited

U.S. PATENT DOCUMENTS 4,062,318 A 12/1977 Ban et al.
4,263,872 A 4/1981 Ban (Continued)

FOREIGN PATENT DOCUMENTS

JP 60-189220 9/1985
JP 61-283114 12/1986

(Continued)

OTHER PUBLICATIONS

Japanese language office action and its English translation for corresponding Japanese application No. 2002-003615 dated Mar. 14, 2006.

(Continued)

*Primary Examiner* — Roberts Culbert
(74) *Attorney, Agent, or Firm* — DLA Piper LLP (US)

(57) ABSTRACT

A plasma processing apparatus comprises a processing chamber in which a plurality of substrates are stacked and accommodated; a pair of electrodes extending in the stacking direction of the plurality of substrates, which are disposed at one side of the plurality of substrates in said processing chamber, and to which high frequency electricity is applied; and a gas supply member which supplies processing gas into a space between the pair of electrodes.

18 Claims, 15 Drawing Sheets

Related U.S. Application Data application No. 11/688,730, filed on Mar. 20, 2007, now Pat. No. 8,028,652, which is a continuation of application No. 10/339,639, filed on Jan. 9, 2003, now abandoned.

(51) Int. Cl.

| | |
|---|---|
| *C03C 15/00* | (2006.01) |
| *C23F 1/00* | (2006.01) |
| *H01L 21/02* | (2006.01) |
| *C23C 16/452* | (2006.01) |
| *C23C 16/455* | (2006.01) |
| *C23C 16/458* | (2006.01) |
| *C23C 16/54* | (2006.01) |
| *H01J 37/32* | (2006.01) |
| *H01L 21/67* | (2006.01) |
| *H01L 21/205* | (2006.01) |
| *H01L 21/77* | (2006.01) |
| *H01L 21/316* | (2006.01) |

(52) U.S. Cl.
CPC ........ *C23C16/4584* (2013.01); *C23C 16/45525* (2013.01); *C23C 16/45542* (2013.01); *C23C 16/45546* (2013.01); *C23C 16/45578* (2013.01); *C23C 16/54* (2013.01); *H01J 37/3244* (2013.01); *H01J 37/32357* (2013.01); *H01J 37/32513* (2013.01); *H01J 37/32541* (2013.01); *H01J 37/32834* (2013.01); *H01L 21/02183* (2013.01); *H01L 21/02205* (2013.01); *H01L 21/02211* (2013.01); *H01L 21/205* (2013.01); *H01L 21/67109* (2013.01); *H01L 21/77* (2013.01); *H01J 2237/332* (2013.01); *H01L 21/31604* (2013.01)

(56) References Cited

U.S. PATENT DOCUMENTS

| | | |
|---|---|---|
| 4,992,301 A | 2/1991 | Shishiguchi et al. |
| 5,015,330 A | 5/1991 | Okumura et al. |
| 5,217,560 A | 6/1993 | Kurono et al. |
| 5,383,984 A | 1/1995 | Shimada et al. |
| 6,424,091 B1 | 7/2002 | Sawada et al. |
| 7,861,668 B2 | 1/2011 | Toyoda et al. |
| 7,900,580 B2 | 3/2011 | Kontani et al. |
| 8,020,514 B2 | 9/2011 | Toyoda et al. |
| 8,028,652 B2 | 10/2011 | Toyoda et al. |
| 8,047,158 B2 | 11/2011 | Kontani et al. |
| 8,261,692 B2 | 9/2012 | Kontani et al. |
| 8,453,600 B2 | 6/2013 | Miyashita et al. |

FOREIGN PATENT DOCUMENTS

| | | |
|---|---|---|
| JP | 62-196820 | 8/1987 |
| JP | 62-245626 | 10/1987 |
| JP | 02-011327 | 1/1990 |
| JP | 05-102040 | 4/1993 |
| JP | 05-251391 | 9/1993 |
| JP | 08-130210 | 5/1996 |
| JP | 09-055372 | 2/1997 |
| JP | 09-115693 | 5/1997 |
| JP | 2000-200774 | 7/2000 |

OTHER PUBLICATIONS

Japanese language office action and its English translation for corresponding Japanese application No. 2002-003615 dated Jan. 23, 2007.
Japanese language office action and its English translation for corresponding Japanese application No. 2004-127760 dated Nov. 6, 2007.
Japanese language office action and its English translation for corresponding Japanese application No. 2012-12249258 dated Aug. 22, 2013.
Goto et al. "Atomic layer controlled deposition of silicon nitride with self-limiting mechanism" Appl. Phys. Lett. vol. 68, No. 23, pp. 3257-3259, Jun. 3, 1996.

BATCH-TYPE REMOTE PLASMA PROCESSING APPARATUS

BACKGROUND OF THE INVENTION

1. Field of the Invention

The present invention relates to a plasma processing apparatus, and more particularly, to a batch-type remote plasma processing apparatus, e.g., to an apparatus which is effectively utilized for depositing an insulative film or a metal film on a semiconductor wafer (wafer, hereinafter) on which a semiconductor integrated circuit including semiconductor elements is formed in producing a semiconductor device.

2. Description of the Related Art

As a conventional batch-type remote plasma processing apparatus, a single wafer-feeding type remote plasma CVD apparatus has been used. However, in the single wafer-feeding type remote plasma CVD apparatus, since wafers are processed one by one, there has been a problem that throughput is small.

SUMMARY OF THE INVENTION

Therefore, it is a main object of the present invention to provide a plasma processing apparatus capable of obtaining great throughput.

According to a first aspect of the present invention, there is provided a plasma processing apparatus, comprising
a processing chamber in which a plurality of substrates are stacked and accommodated,
a pair of electrodes extending in the stacking direction of the plurality of substrates, the electrodes being disposed at one side of the plurality of substrates in the processing chamber, and high frequency electricity being applied to the electrodes, and
a gas supply member which supplies processing gas into a space between the pair of electrodes.

According to a second aspect of the present invention, there is provided a plasma processing apparatus, comprising:
a processing chamber in which a plurality of substrates are stacked and accommodated,
a pair of electrodes which is disposed inside and outside of the processing chamber such as to be opposed to each other at one side of the plurality of substrates, and to which high frequency electricity is applied, and
a gas supplying pipe which supplies processing gas into the processing chamber to a place which is away from the space between the pair of electrodes.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
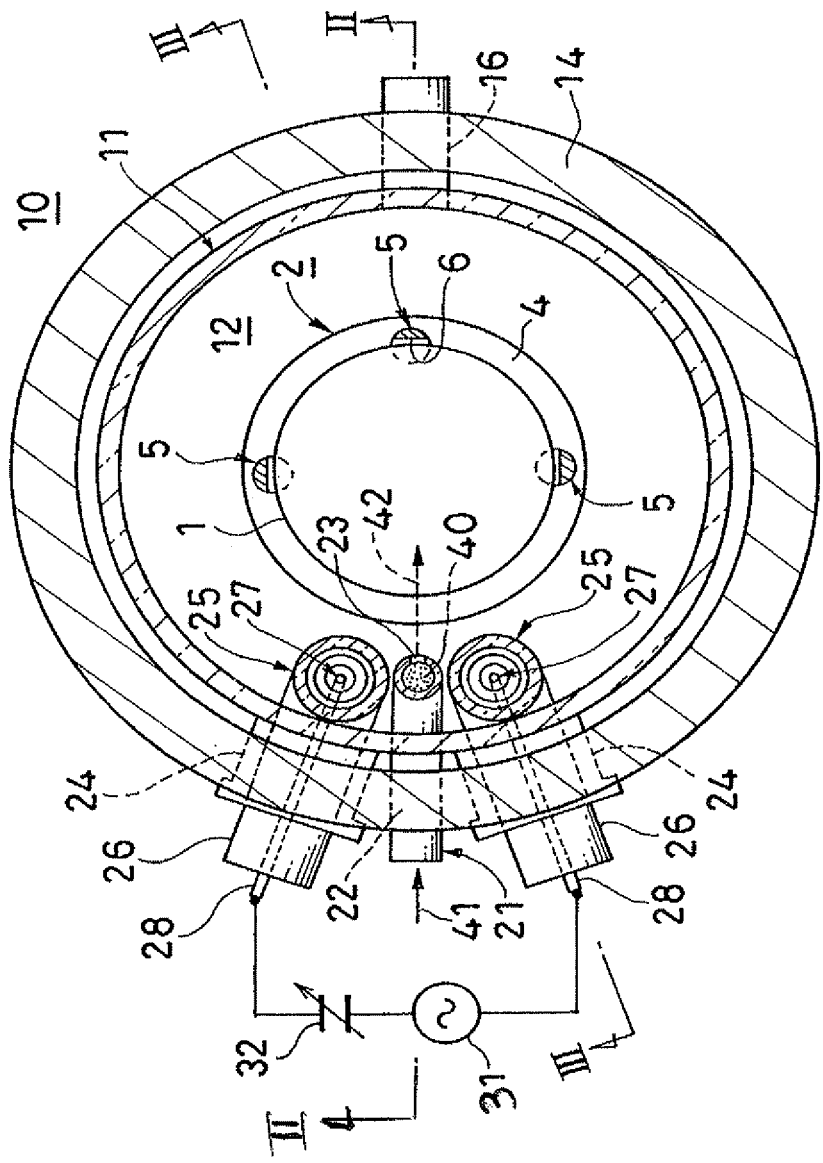
FIG. 1 is a transversal sectional view of a CVD apparatus according to a first embodiment of the present invention.

In order to form a capacitance portion (insulative film) of a capacitor of a DRAM (Dynamic Random Access Memory) which is one example of a semiconductor integrated circuit apparatus, studies are carried out for using a tantalum pentoxide ($Ta_2O_5$). Since $Ta_2O_5$ has high dielectric constant, it is suitable for obtaining great capacitance with a fine area. In a producing method of the DRAM, it is desired to form a $Ta_2O_5$ film by an MOCVC apparatus in view of productivity, quality of film and the like.

It is know that if the $Ta_2O_5$ film is formed by the MOCVD apparatus, carbon (C) which may generate leak current adheres to a surface of the $Ta_2O_5$ film or in the vicinity of the surface. Therefore, after the $Ta_2O_5$ film is formed on a wafer, it is necessary to eliminate carbon existing in the vicinity of the surface of the $Ta_2O_5$ film. A single wafer-feeding type remote plasma CVD apparatus can lower a heating temperature of a wafer to 300 to 400° C. while preventing plasma damage of a wafer. Therefore, studies are carried out for eliminating the carbon on a $Ta_2O_5$ film by the single wafer-feeding type remote plasma CVD apparatus.

In the single wafer-feeding type remote plasma CVD apparatus, however, since carbon of the $Ta_2O_5$ film is eliminated one by one, there is a problem that throughput becomes small. For example, if net processing time in a single wafer-feeding type remote plasma CVD apparatus is ten minutes and operation time of a transfer system is two minutes, the processing number of wafers per one hour is as small as five.

A general single wafer-feeding type remote plasma CVD apparatus is of a cold wall type in which only a susceptor is heated to a processing temperature. Therefore, in such a single wafer-feeding type remote plasma CVD apparatus, there are problems that it is difficult to uniformly heat the entire surface of a wafer, and it is difficult to heat the wafer to 400° C. or higher due to a problem of selection of material of a chamber. Further, when a heater is embedded into a susceptor and a wafer is heated, since heat is not uniformly transferred to the wafer due to warpage of the wafer or roughness of a surface of the wafer, it is difficult to heat the wafer to 500° C.±1%. Therefore, it is conceived to use a heater having an electrostatic fastener, but the heater having an electrostatic fastener is extremely expensive, and the reliability is low with respect to its price.

It is, therefore, a main object of preferred embodiment of the present invention to provide a plasma processing apparatus capable of obtaining great throughput, and capable of enhancing uniformity of a temperature of a substrate to be processed.

A plasma processing apparatus according to one preferred aspect of the present invention, comprises:

a processing chamber in which a plurality of substrates are stacked and accommodated, and a pair of electrodes extending in the stacking direction of the plurality of substrates, the electrodes being disposed at one side of said plurality of substrates in the processing chamber, and high frequency electricity being applied to the electrodes, wherein the processing apparatus is constituted such that processing gas is supplied into a space between the pair of electrodes.

A plasma processing apparatus according to another aspect of the present invention, comprises:

a processing chamber in which a plurality of substrates are stacked and accommodated, and a pair of electrodes extending in the stacking direction of the plurality of substrates, the electrodes being disposed inside and outside of the processing chamber and at one side of the plurality of substrates, and high frequency electricity being applied to said electrodes, wherein the processing apparatus is constituted such that processing gas is supplied into a space between the pair of electrodes.

A plasma processing apparatus according to still another aspect of the present invention, comprises:

a processing chamber in which a plurality of substrates are stacked and accommodated, a pair of electrodes extending in the stacking direction of the plurality of substrates, said electrodes being disposed at one side of the plurality of substrates, and high frequency electricity being applied to the electrodes, and an electrical discharging chamber which is separated from the processing chamber and which includes a space between the pair of electrodes, wherein a gas blowout opening for supplying the processing gas into the processing chamber is provided in the electrical discharging chamber.

In the above-mentioned batch-type remote plasma processing apparatuses according to each aspect of the present invention, when high frequency electricity is applied between the pair of electrodes, plasma is generated between the pair of electrodes. When the processing gas is supplied into this plasma atmosphere, active particles are formed, and if the active particles are supplied to the plurality of substrates which were transferred into a process tube, the plurality of substrates are collectively subjected to plasma processing.

Since the plurality of substrates to be processed are collectively batch-processed, it is possible to largely enhance the throughput as compared with a case in which the substrates to be processed are processed one by one (single substrate-processing). Further, the entire surface of each substrate can be heated uniformly by heating the plurality of substrates accommodated in the processing chamber by a hot-wall type heater. Therefore, processing of substrate by plasma can be carried out uniformly.

Next, preferred embodiments according to the present invention will be explained in detail.

(First Embodiment)

Figure 2:
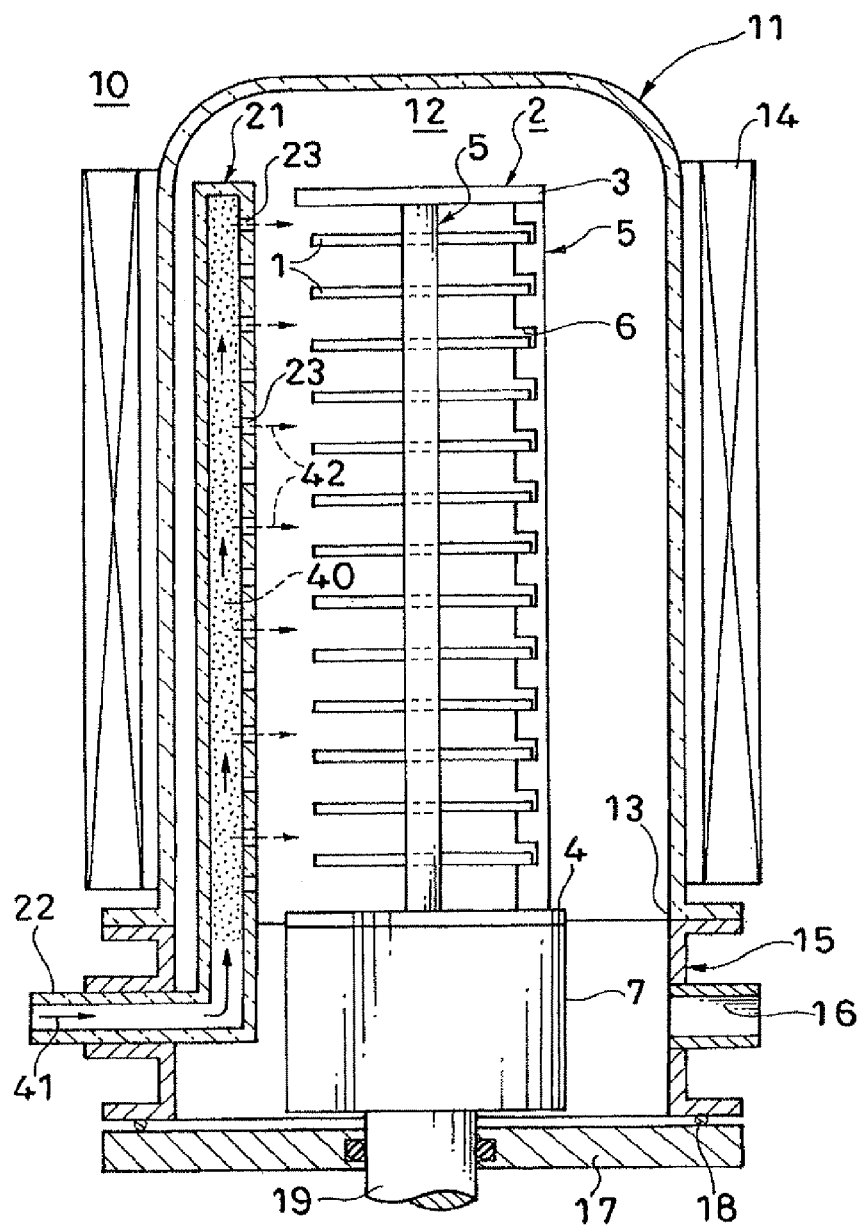
FIG. 2 is a longitudinal sectional view taken along a line II-II of FIG. 1.
Figure 3:
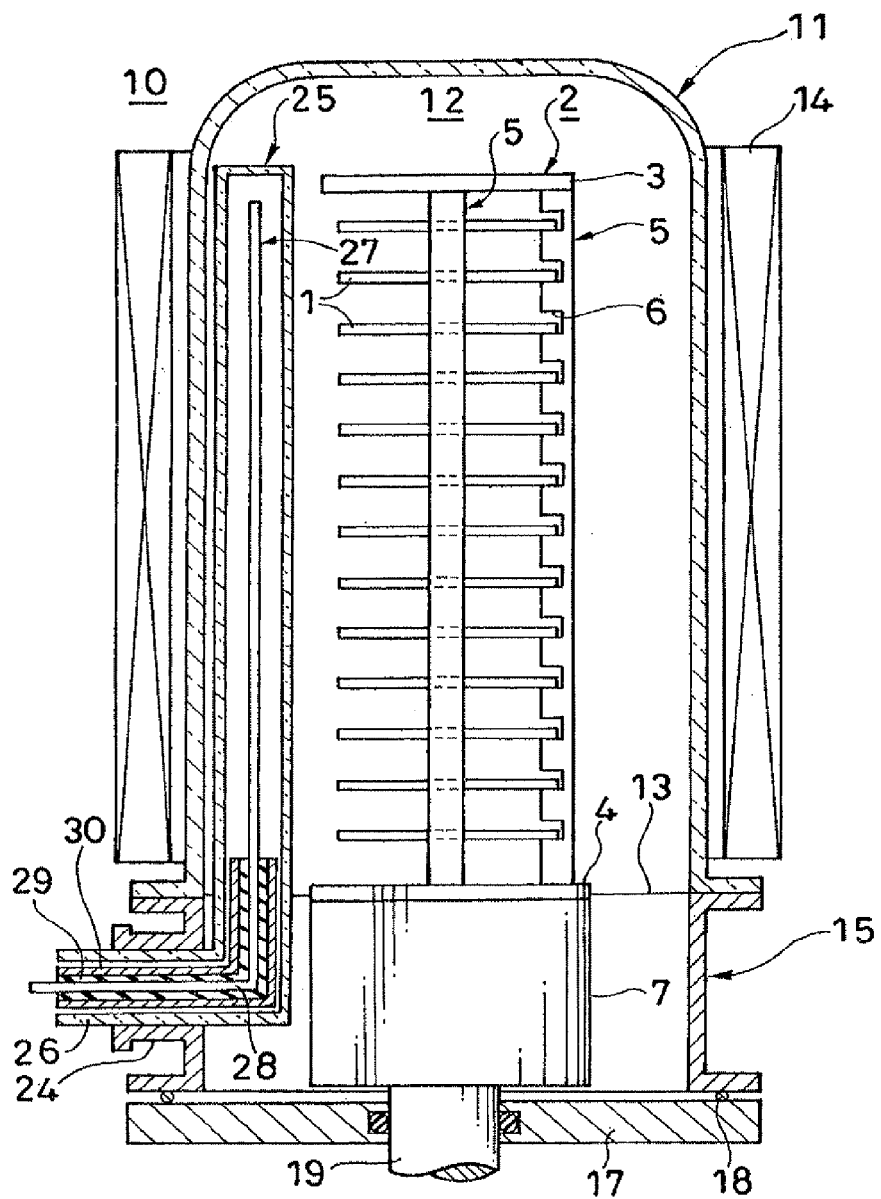
FIG. 3 is a longitudinal sectional view taken along a line III-III of FIG. 1.

In this embodiment, as shown in FIGS. 1 to 3, a batch-type remote plasma processing apparatus of the invention is formed as a batch-type vertical hot wall type remote plasma CVD apparatus (CVD apparatus, hereinafter). That is, a CVD apparatus 10 is made of material having high heat resistance such as quartz glass or the like. The CVD apparatus 10 is provided with a cylindrical process tube 11. One end of the process tube 11 is opened and the other end thereof is closed. The process tube 11 is vertically fixedly supported such that a center line of the tube 11 is vertically directed. A cylindrical hollow portion of the process tube 11 forms a processing chamber 12 in which a plurality of wafers 1 are accommodated. A lower end opening of the process tube 11 is formed into a furnace opening 13 through which the wafer 1 as a subject to be processed is loaded and unloaded. An inner diameter of the process tube 11 is set greater than a maximum outer diameter of the wafer 1 to be handled.

Heaters 14 for uniformly heating the entire processing chamber 12 are concentrically provided around the process tube 11 such as to surround the process tube 11. The heaters 14 are supported by a machine frame (not shown) of the CVD apparatus 10 such that the heaters 14 are mounted vertically.

A manifold 15 abuts against a lower end surface of the process tube 11. The manifold 15 is made of metal. The manifold 15 is formed into a cylindrical shape which is provided at its upper and lower ends with flanges. The flanges project outward in a diametrical direction of the manifold 15. The manifold 15 is detachably mounted to the process tube 11 for maintenance operation and cleaning operation for the process tube 11. The manifold 15 is supported by a machine frame (not shown) of the CVD apparatus 10 and the process tube 11 is mounted vertically.

One end of an exhaust pipe 16 is connected to a portion of a sidewall of the manifold 15. The other end of the exhaust pipe 16 is connected to an exhaust apparatus (not shown) so that the processing chamber 12 can be evacuated. A seal cap 17 which closes a lower end opening of the manifold 15 abuts against the lower end opening of the manifold 15 from vertically lower side through a seal ring 18. The seal cap 17 is formed into a disc-like shape having substantially the same outer diameter as that of the manifold 15. The seal cap 17 is moved up and down in the vertical direction by an elevator (not shown) which is vertically provided outside the process tube 11. A rotation shaft 19 passes through a center line of the seal cap 17. The rotation shaft 19 is moved up and down together with the seal cap 17, and is rotated by a rotating driving apparatus (not shown). A boat 2 which holds the wafers 1 as subjects to be processed is vertically supported on an upper end of the rotation shaft 19 such as to stand thereon.

The boat 2 comprises a pair of upper and lower end plates 3 and 4, and a plurality of (three, in this embodiment) holding members 5 vertically disposed between the end plates 3 and 4. Each the holding member 5 is provided with a large number of holding grooves 6 which are disposed in the longitudinal direction at equal distances from one another. Outer peripheral edge sides of the wafers 1 are respectively inserted into the large number of holding grooves 6 of the holding member 5. With this design, the wafers 1 are arranged and held horizontally with respect to the boat 2 such that centers of the wafers 1 are aligned to each other. A thermal insulation cap 7 is formed on a lower surface of the lower end plate 4 of the boat 2. A lower end surface of the thermal insulation cap 7 is supported by the rotation shaft 19.

A gas supply pipe 21 for supplying processing gas vertically stands on a position in the vicinity of an inner peripheral surface of the process tube 11 different from a position of the exhaust pipe 16 (at a position on the opposite side from the exhaust pipe 16 through 180° in the illustrated example). The gas supply pipe 21 is made of dielectric material, and is formed into a thin and long circular pipe. A lower end of the gas supply pipe 21 is bent into an elbow shape at right angles to form a gas introducing portion 22. The gas introducing portion 22 passes through a sidewall of the manifold 15 outward in the diametrical direction, and projects outside. A plurality of blowout openings 23 are opened in the gas supply pipe 21 and arranged in the vertical direction. The number of blowout openings 23 corresponds to the number of wafers 1 to be processed. In this embodiment, the number of blowout openings 23 coincides with the number of wafers 1 to be processed, and a height of each blowout opening 23 is set such that each blowout opening 23 is opposed to a space between vertically adjacent wafers 1 held by the boat.

A pair of support cylinders 24 and 24 project outward in the diametrical direction on opposite sides of the gas introducing portion 22 of the gas supply pipe 21 in the manifold 15 in the circumferential direction. Holder portions 26 and 26 of a pair of protect pipes 25 and 25 are supported such that the holder portions 26 and 26 pass through the support cylinders 24 and 24 in the diametrical direction. Each the protect pipe 25 is made of dielectric material, and is formed into a thin and long circular pipe shape whose upper end is closed. Upper and lower ends of the protect pipes 25 are vertically aligned to the gas supply pipe 21. A lower end of each the protect pipe 25 is bent into an elbow shape at right angles to form a the holder portion 26. The holder portion 26 passes through the support cylinder 24 of the manifold 15 outward in the diametrical direction and projects outside. A hollow portion of each the protect pipe 25 is brought into communication with outside (atmospheric pressure) of the processing chamber 12.

A pair of thin and long rod-like electrodes 27 and 27 made of conductive material are concentrically disposed in the hollow portions of the protect pipes 25 and 25. A portion-to-be-held 28 which is a lower end of each the electrode 27 is held by the holder portion 26 through a insulative cylinder 29 and a shield cylinder 30 which prevent electric discharge. A high frequency power source 31 is electrically connected between both the electrodes 27 and 27 through a matching device 32. The high frequency power source 31 applies high frequency electricity.

Next, a method for eliminating carbon existing in the vicinity of a surface of a $Ta_2O_5$ film for a capacitance portion of a capacitor of the DRAM using the CVD apparatus 10 having the above structure will be explained. That is, in this embodiment, it is assumed that the wafer 1 to be supplied to the CVD apparatus 10 is coated with a $Ta_2O_5$ film (not shown) for forming the capacitance portion of the capacitor by a previous MOCVD step, carbon (not shown) exists in the vicinity of a surface of the $Ta_2O_5$ film, and the carbon is to be eliminated by the CVD apparatus 10.

A plurality of wafers 1 as substrates to be processed of the CVD apparatus 10 are charged to the boat 2 by a wafer transfer apparatus (not shown). As shown in FIGS. 2 and 3, the boat 2 into which the plurality of wafers 1 are charged is moved upward by the elevator together with the seal cap 17 and the rotation shaft 19, and is loaded (boat-loaded) into the processing chamber 12 of the process tube 11.

If the boat 2 holding the group of wafers 1 is loaded into the processing chamber 12, the processing chamber 12 is evacuated into a predetermined pressure or lower by an exhaust apparatus connected to the exhaust pipe 16, and a temperature of the processing chamber 12 is increased to a predetermined temperature by increasing electricity supplied to the heaters 14. Since the heater 14 is of the hot wall type structure, a temperature of the processing chamber 12 is uniformly maintained entirely and as a result, a temperature distribution of the group of wafers 1 held by the boat 2 also becomes uniform over the entire length, and a temperature distribution over the entire surface of each the wafer 1 also becomes uniform.

After a temperature of the processing chamber 12 reaches a preset value and is stabilized, oxygen ($O_2$) gas is introduced as processing gas 41, and if a pressure thereof reaches a preset value, the boat 2 is rotated by the rotation shaft 19 and in this state, high frequency electricity is applied between the pair of electrodes 27 and 27 by the high frequency power source 31 and the matching device 32. The oxygen gas which is the processing gas 41 is supplied to the gas supply pipe 21, and if the high frequency electricity is applied between both the electrodes 27 and 27, plasma 40 is formed in the gas supply pipe 21 as shown in FIG. 2, and reaction of the processing gas 41 becomes active.

As shown with broken arrows in FIGS. 1 and 2, activated particles (oxygen radical) 42 of the processing gas 41 are emitted from the blowout openings 23 of the gas supply pipe 21 into the processing chamber 12.

The activated particles (active particles, hereinafter) 42 are emitted from the blowout openings 23, and flow between the opposed wafers 1 and 1 and come into contact with the wafers 1. Therefore, the contact distribution of the active particles 42 with respect to the entire group of wafers 1 becomes uniform over the entire length of the boat 2, and a contact distribution of the entire surface of each the wafer 1 in its diametrical direction which corresponds to a flowing direction of the active particles also becomes uniform. At that time, since the wafer 1 is rotated by rotation of the boat 2, a contact distribution of the entire surface of the wafer of the active particles 42 which flow between the wafers 1 and 1 also becomes uniform in the circumferential direction.

The active particles (oxygen radical) 42 which came into contact with the wafers 1 thermally reacts with carbon which exists in the vicinity of a surface of the $Ta_2O_5$ film to generate CO (carbon monoxide), thereby eliminating carbon from the $Ta_2O_5$ film. At that time, as described above, the temperature distribution of the wafers 1 is maintained uniform over the entire length of the boat 2 and over the entire surface of the wafer, and the contact distribution of the active particles 42 with the wafers 1 is uniform over the all positions of the boat 2 and the entire surface of the wafer. Therefore, the eliminating effect of carbon on the wafers 1 by the thermal reaction of the active particles 42 becomes uniform over the all positions of the boat 2 and the entire surface of the wafer.

Processing conditions for eliminating carbon from the $Ta_2O_5$ film to form a capacitance portion of capacitor of the DRAM are as follows: a supply flow rate of oxygen gas used as the processing gas is $8.45 \times 10^{-1}$ to $3.38$ Pa·m³/s, a pressure in the processing chamber is 10 to 100 Pa, and a temperature thereof is 500 to 700° C.

If a preset processing time is elapsed, after supply of processing gas 41, rotation of rotation shaft 19, application of high frequency electricity, heating of heaters 14, and evacuation of the exhaust pipe 16 are stopped, if the seal cap 17 is lowered, the furnace opening 13 is opened, and the group of wafers 1 is transferred out from the processing chamber 12 from the furnace opening 13 (the boat is unloaded).

The group of wafers 1 transferred outside of the processing chamber 12 is discharged (unloaded) from the boat 2 by the wafer transfer apparatus. Thereafter, the above operation is repeated, thereby collectively batch processing the plurality of wafers 1.

According to the above embodiment, the following effects can be obtained.

1) The plurality of wafers are collectively batch processed. Therefore, it is possible to largely enhance the throughput as compared with a case in which the substrates to be processed are processed one by one. For example, the number of substrates which are processed per one hour when the substrates are processed one by one is five if the processing time is 10 minutes and the operation time of a transfer system is two minutes. Whereas, the number of substrates which are batch processed per one hour is 66.7 if the processing time is 30 minutes and the operation time of a transfer system is 60 minutes.

2) By heating the plurality of wafers which were held by the boat and transferred into the processing chamber by means of the hot wall type heaters, it is possible to uniformly distribute a temperature of the wafers over the entire length of the boat and over the entire surface of each wafer. Therefore, it is possible to uniform the processing state of wafers by the active particles which are formed by activating the processing gas by plasma, i.e., the eliminating distribution of carbon on the $Ta_2O_5$ film.

3) By disposing the pair of thin and long electrodes in the processing chamber such that the electrodes are opposed to each other, it is possible to form plasma over the entire length of both the electrodes. Therefore, it is possible to more uniformly supply the active particles which are formed by activating the processing gas by plasma, over the entire length of the group of wafers held by the boat.

4) By disposing the gas supplying pipe in the space between the pair of thin and long electrodes to which the processing gas is supplied, it is possible to activate the processing gas by plasma in the gas supplying pipe. Therefore, it is possible to prevent the wafer from being damaged by plasma, and it is possible to prevent the yield of wafers from being deteriorated by the plasma damage.

5) The blowout opening is formed in the gas supplying pipe such that the blowout opening is opposed to a space between the upper and lower wafers held by the boat. With this structure, the active particles are allowed to flow between the wafers. Therefore, it is possible to uniform the contact distribution of the active particles with respect to the group of wafers over the entire length of the boat. As a result, it is possible to further uniform the processing state by the active particles.

6) By rotating the boat which holds the plurality of wafers, the contact distribution of the active particles which flowed between the wafers can be uniformed over the entire surface of the wafer in the circumferential direction. Therefore, it is possible to further uniform the processing state by the active particles.

7) By eliminating the carbon of the $Ta_2O_5$ film used for the capacitance portion of the capacitor of the DRAM, it is possible to reduce the leak current between the electrodes of the capacitor. Therefore, it is possible to enhance the performance of the DRAM.

(Second Embodiment)

Figure 4:
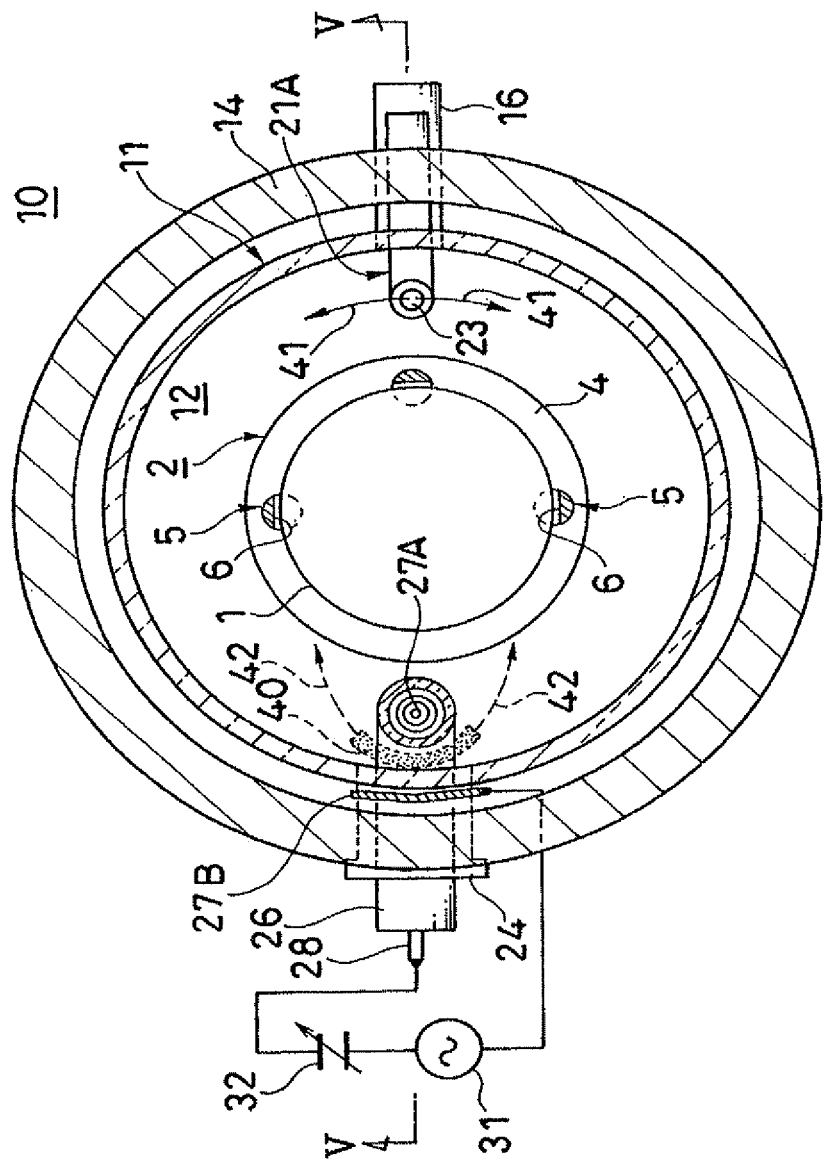
FIG. 4 is a transversal sectional view of a CVD apparatus according to a second embodiment of the present invention.
Figure 5:
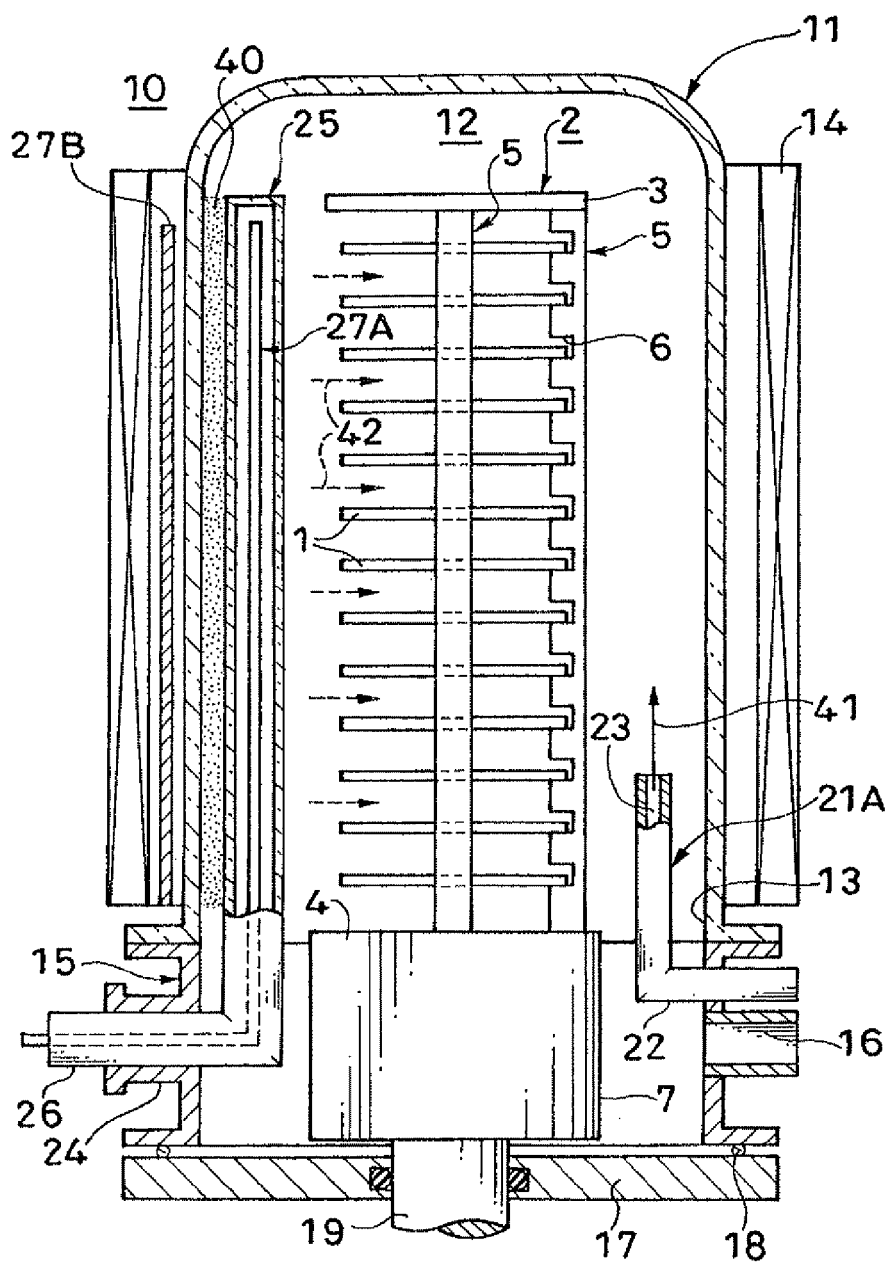
FIG. 5 is a longitudinal sectional view taken along a line V-V of FIG. 4.

A CVD apparatus of the second embodiment of the present invention will be explained with reference to FIGS. 4 and 5.

The second embodiment is different from the first embodiment in that a pair of electrodes 27A and 27B are disposed inside and outside of the process tube 11, and a gas supply pipe 21A is located at a position other than a space to which the electrodes 27A and 27B are opposed.

In this embodiment, the high frequency electricity is applied between the inner electrode 27A and the outer electrode 27B by the high frequency power source 31 and the matching device 32, and if processing gas 41 is supplied to the processing chamber 12 by the gas supply pipe 21A, plasma 40 is formed between a sidewall of the process tube 11 and the inner electrode 27A, and the processing gas 41 is brought into a reaction active state. The active particles 42 are dispersed over the entire processing chamber 12 so that the active particles 42 come into contact with each wafer 1. The active particles 42 which came into contact with the wafer 1 eliminate carbon which exists on the $Ta_2O_5$ film of the wafer 1 by thermal reaction.

(Third Embodiment)

Figure 6:
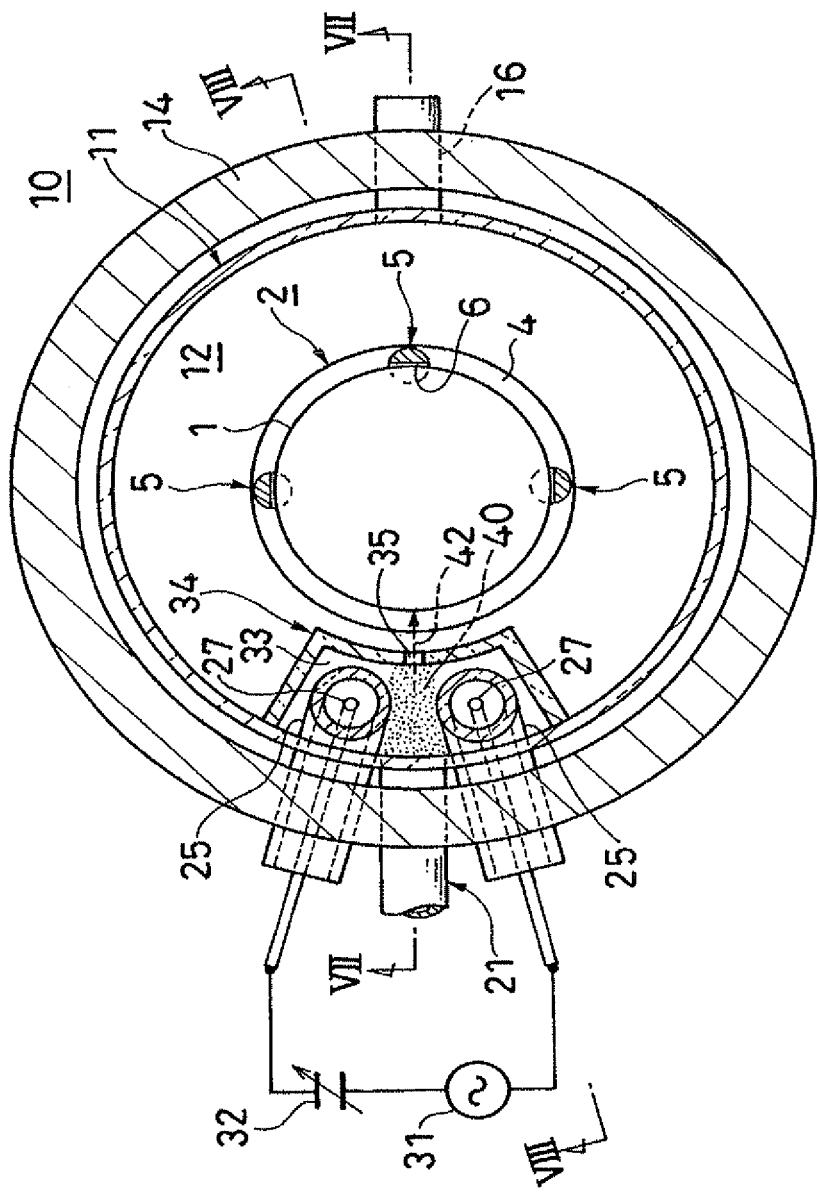
FIG. 6 is a transversal sectional view of a CVD apparatus according to a third embodiment of the present invention.
Figure 7:
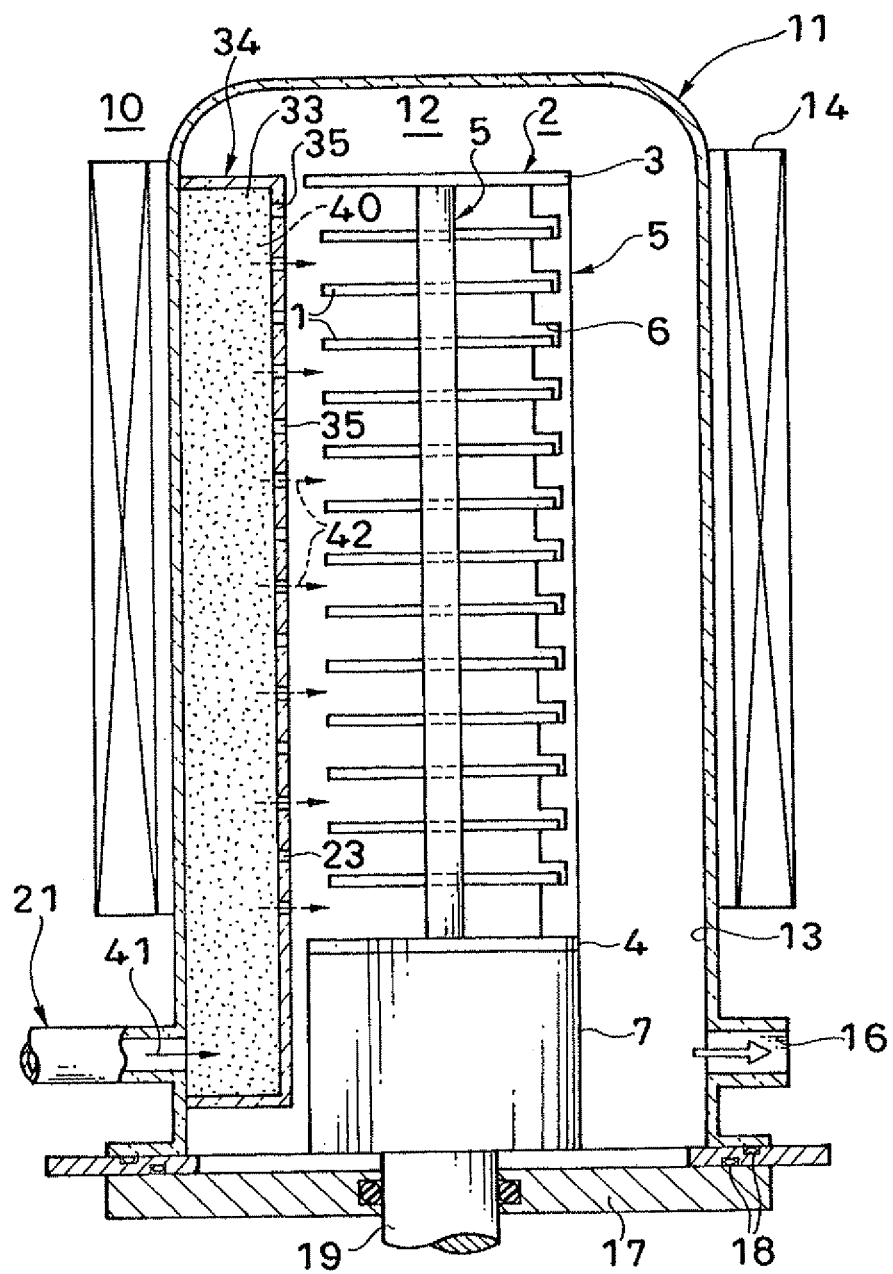
FIG. 7 is a longitudinal sectional view taken along a line VII-VII of FIG. 6.
Figure 8:
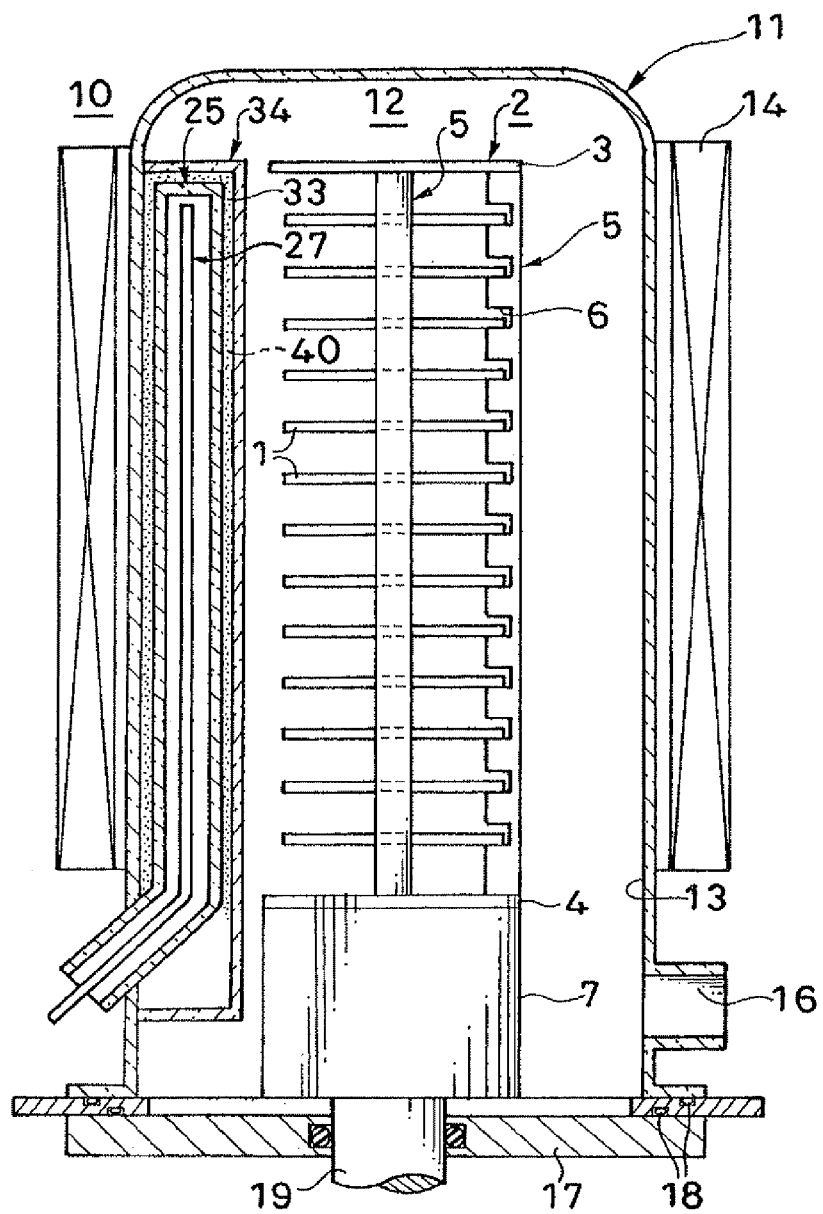
FIG. 8 is a longitudinal sectional view taken along a line VIII-VIII of FIG. 6.

A CVD apparatus of the third embodiment of the present invention will be explained with reference to FIGS. 6 to 8.

In the third embodiment, a pair of protect pipes 25 and 25 provided vertically along an inner wall surface of the process tube 11 are bent at lower portions thereof and pass through a side surface of the process tube 11. A pair of electrodes 27 and 27 are inserted through both the protect pipes 25 and 25 from a lower portion of the side surface of the process tube 11. A guttering-like partition 34 forming a plasma chamber 33 is disposed around an inner peripheral of the process tube 11 such as to air-tightly surround both the protect pipes 25 and 25. A plurality of blowout openings 35 are arranged in the partition 34 such as to be opposed to a space between the upper and lower wafers 1 and 1. A gas supply pipe 21 is provided at a position of a lower portion of a side surface of the process tube 11 where gas can be supplied to the plasma chamber 33.

After the processing gas 41 is supplied to the plasma chamber 33 and a pressure of the gas is maintained at a predetermined value, if the high frequency electricity is applied between both the electrodes 27 and 27 by the high frequency power source 31 and the matching device 32, plasma 40 is formed in the plasma chamber 33 and the processing gas 41 is activated. Activated electrically neutral particles 42 are emitted from the blowout openings 35 which are opened at the partition 34 and are supplied to the processing chamber 12, and the particles come into contact with each wafer 1 held by the boat 2. The active particles 42 which came into contact with wafer 1 processes a surface of the wafer 1.

(Fourth Embodiment)

Figure 9:
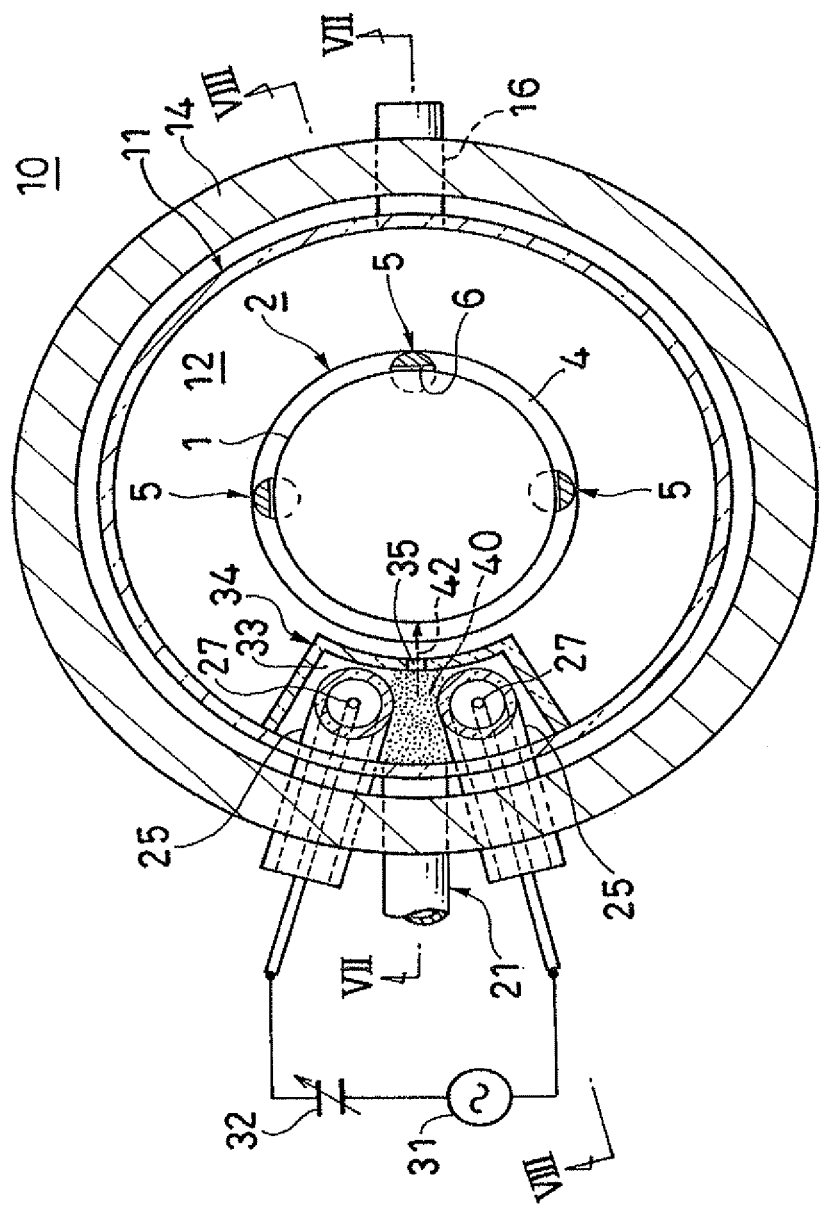
FIG. 9 is a transversal sectional view of a CVD apparatus according to a fourth embodiment of the present invention.

A CVD apparatus of the fourth embodiment of the present invention will be explained with reference to FIG. 9.

This embodiment is different from the third embodiment in that the pair of electrodes 27 and 27 and their protect pipes 25 are located closer to the partition 34 provided with blowout openings 35 than the process tube 11.

If the protect pipes 25 are located closer to the partition 34 than the process tube 11 in this manner, it is possible to limit the gas flow between the protect pipe 25 and the partition 34. As a result, most of processing gas pass between the two protect pipes 25, i.e., pass through a space having great plasma density.

(Fifth Embodiment)

Figure 10:
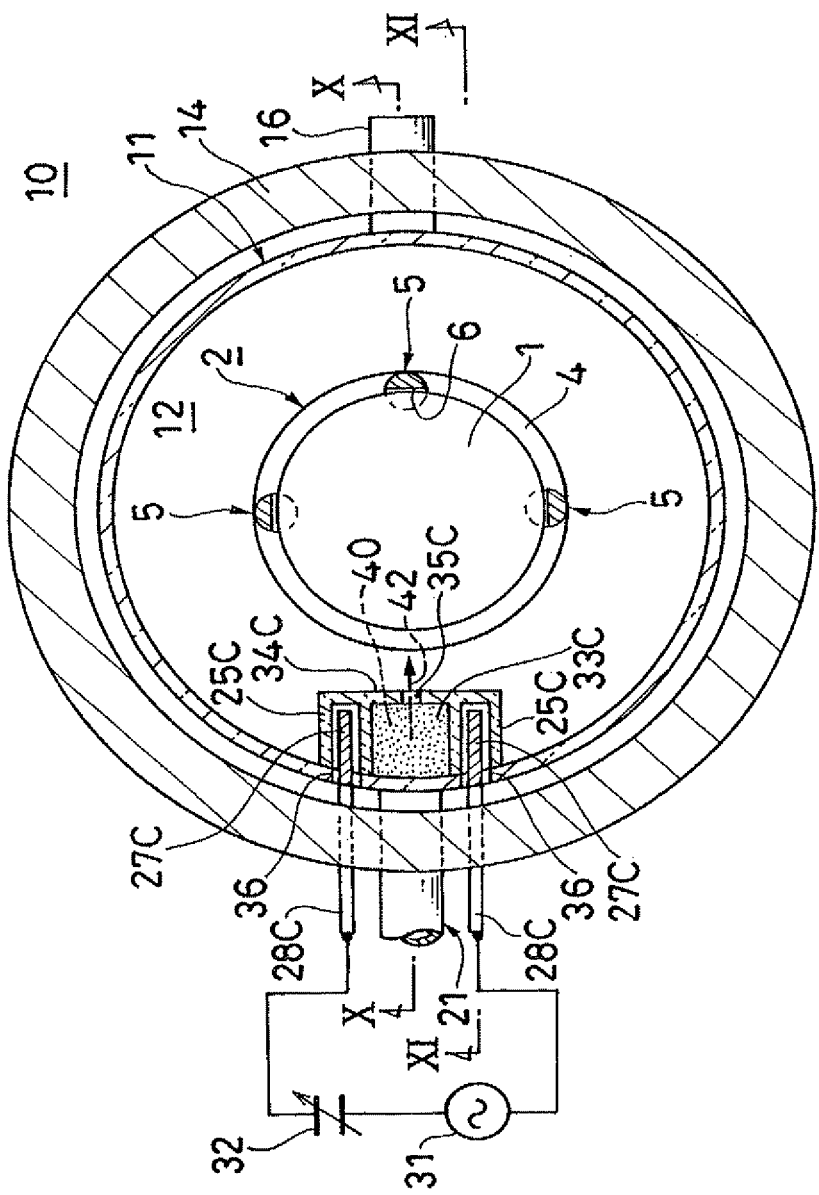
FIG. 10 is a transversal sectional view of a CVD apparatus according to the fourth embodiment of the present invention.
Figure 11:
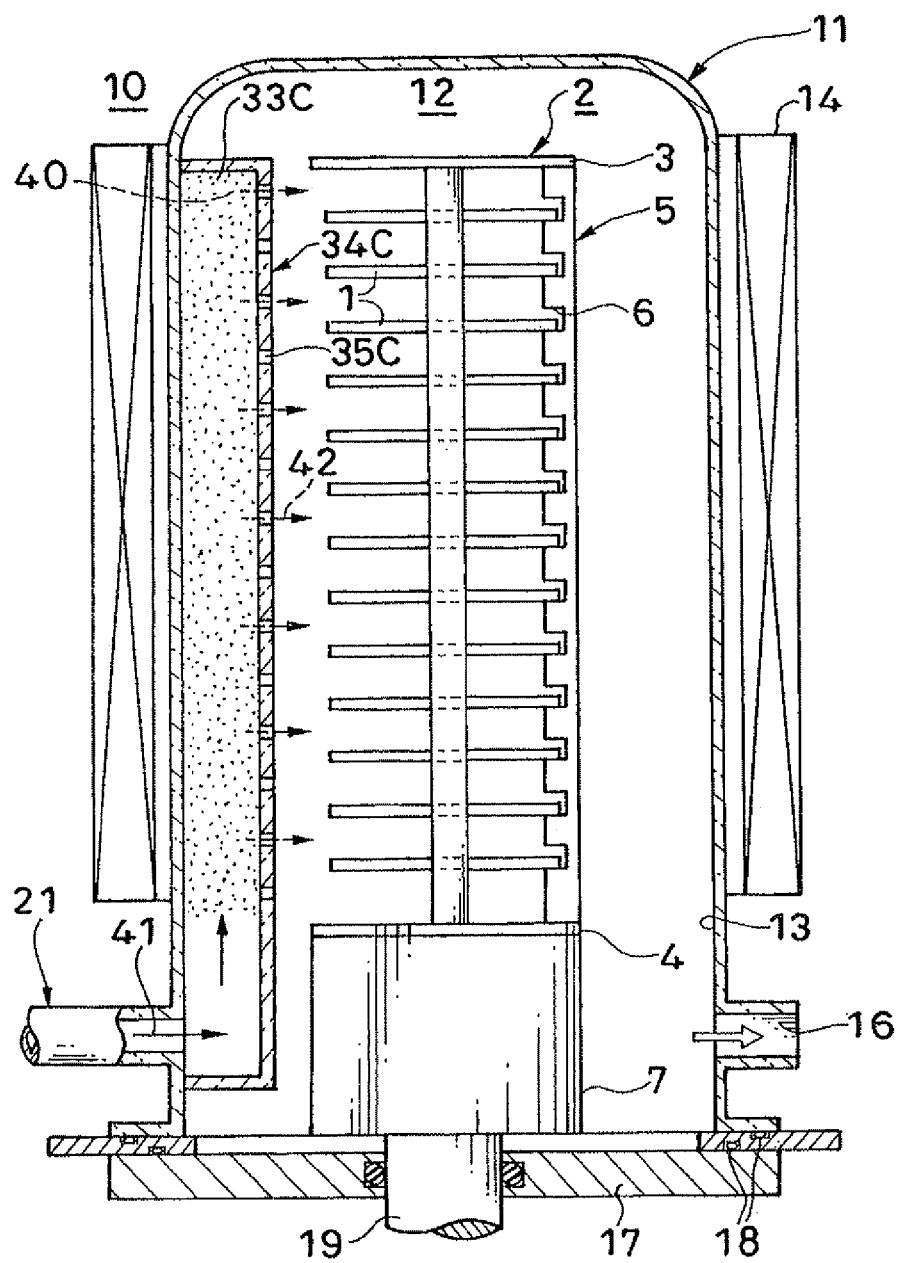
FIG. 11 is a longitudinal sectional view taken along a line X-X of FIG. 9.
Figure 12:
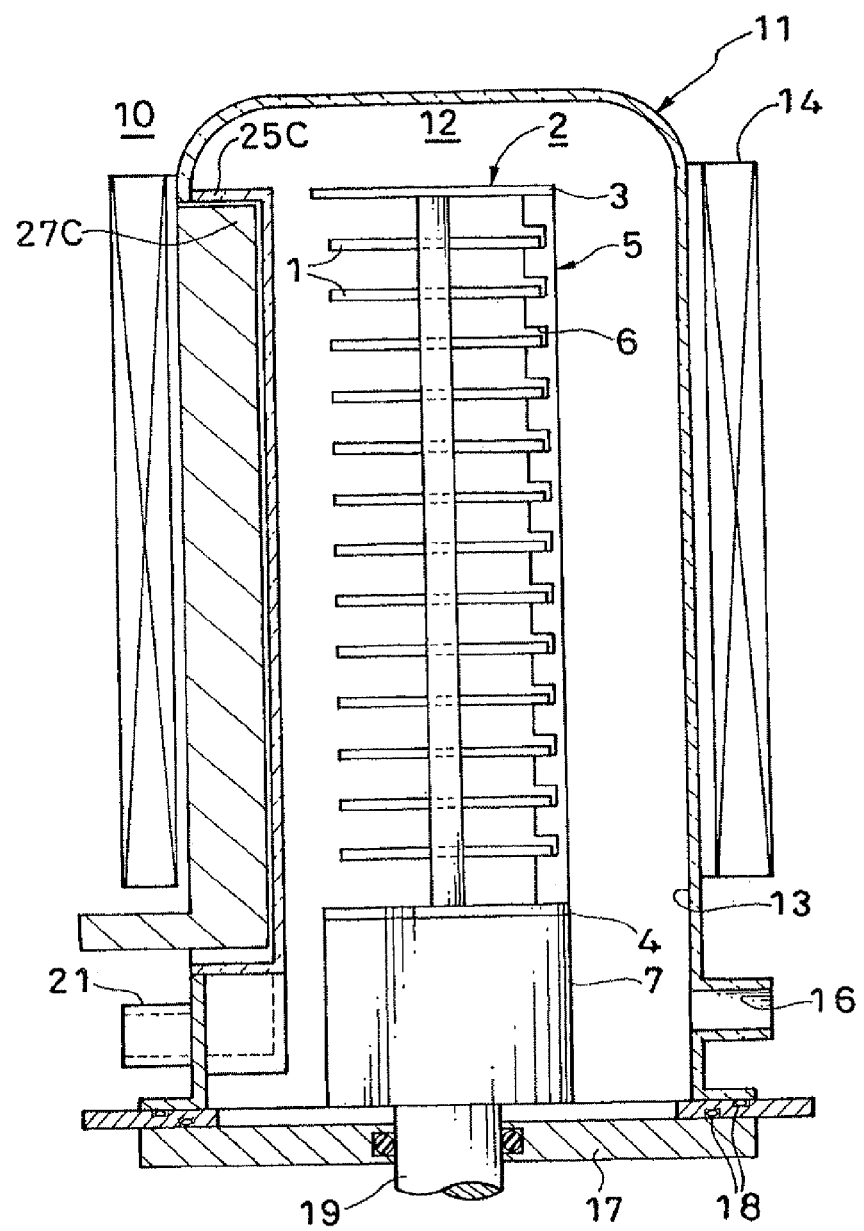
FIG. 12 is a longitudinal sectional view taken along a line XI-XI of FIG. 9.

A CVD apparatus of the fifth embodiment of the present invention will be explained with reference to FIGS. 10 to 12.

A CVD apparatus of this embodiment includes a pair of thin and long flat plate-like electrodes 27C and 27C which are shorter than the process tube 11. Both the electrodes 27C and 27C are inserted, from outside of the process tube 11, into a pair of electrode insertion openings 36 and 36 which extend in the vertical direction in a state in which the electrodes 27C and 27C are in parallel to a portion of the sidewall of the process tube 11 and upper and lower ends of the electrodes 27C and 27C are aligned to each other. A protect pipes 25C and 25C project from an inner peripheral surface of the process tube 11 such as to be opposed to the pair of electrode insertion openings 36 and 36, respectively. Inserting ends of the electrodes 27C and 27C are inserted into the pair of protect pipes 25C and 25C and surrounded. A distance between the electrode insertion opening and protect pipe 25C is set slightly greater than a thickness of the electrode 27C so that the electrode 27C is exposed to atmospheric pressure. Connecting portions 28C and 28C respectively project from lower ends of the electrodes 27C and 27C. The high frequency power source 31 for applying high frequency electricity is electrically connected to the connecting portions 28C and 28C through the matching device 32. A flat plate-like partition 34C which forms a plasma chamber 33C in cooperation with both the protect pipes 25C and 25C is provided between both the protect pipes 25C and 25C. A plurality of blowout openings 35C are arranged in the partition 34C such as to be opposed to the upper and lower wafers 1 and 1. Processing gas 41 is supplied from the gas supply pipe 21 into the plasma chamber 33C.

After the processing gas 41 is supplied to the plasma chamber 33C by the gas supply pipe 21 and a pressure of the gas is maintained at a predetermined value, if the high frequency electricity is applied between both the electrodes 27C and 27C by the high frequency power source 31 and the matching device 32, plasma 40 is formed in the plasma chamber 33C and the processing gas 41 is activated. The activated particles 42 are emitted from the blowout openings 35C which are opened at the partition 34C and are supplied to the processing chamber 12, and the particles come into contact with each wafer 1 held by the boat 2. The active particles 42 which came into contact with wafer 1 processes a surface of the wafer 1.

(Sixth Embodiment)

Figure 13:
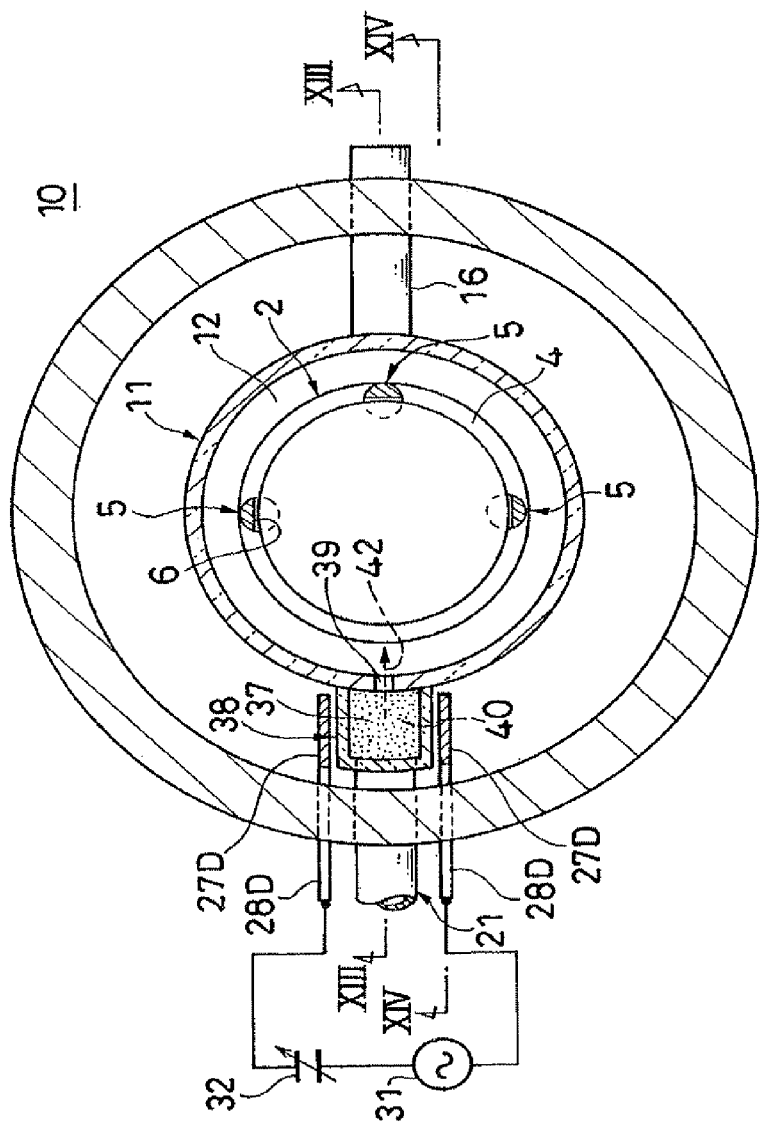
FIG. 13 is a transversal sectional view of a CVD apparatus according to a fifth embodiment of the present invention.
Figure 14:
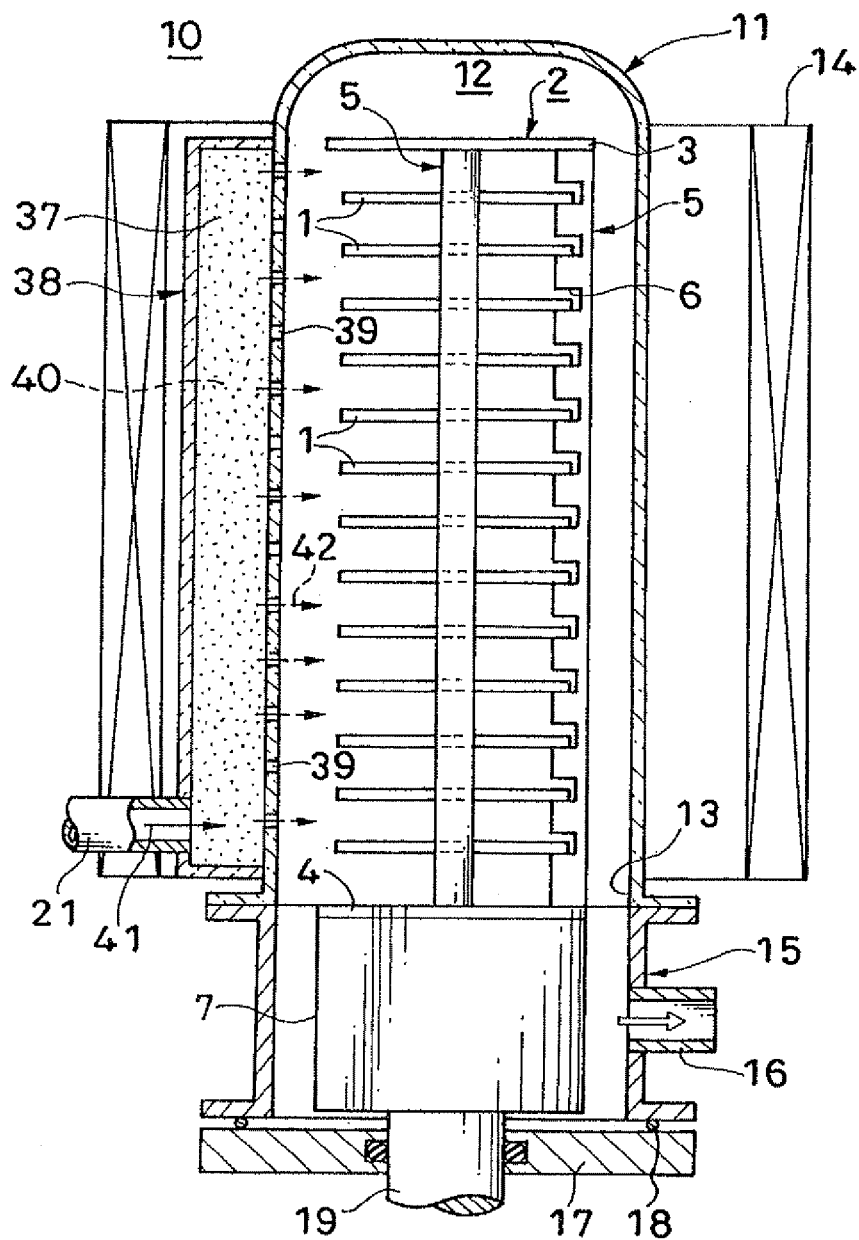
FIG. 14 is a longitudinal sectional view taken along a line XIII-XIII of FIG. 12.
Figure 15:
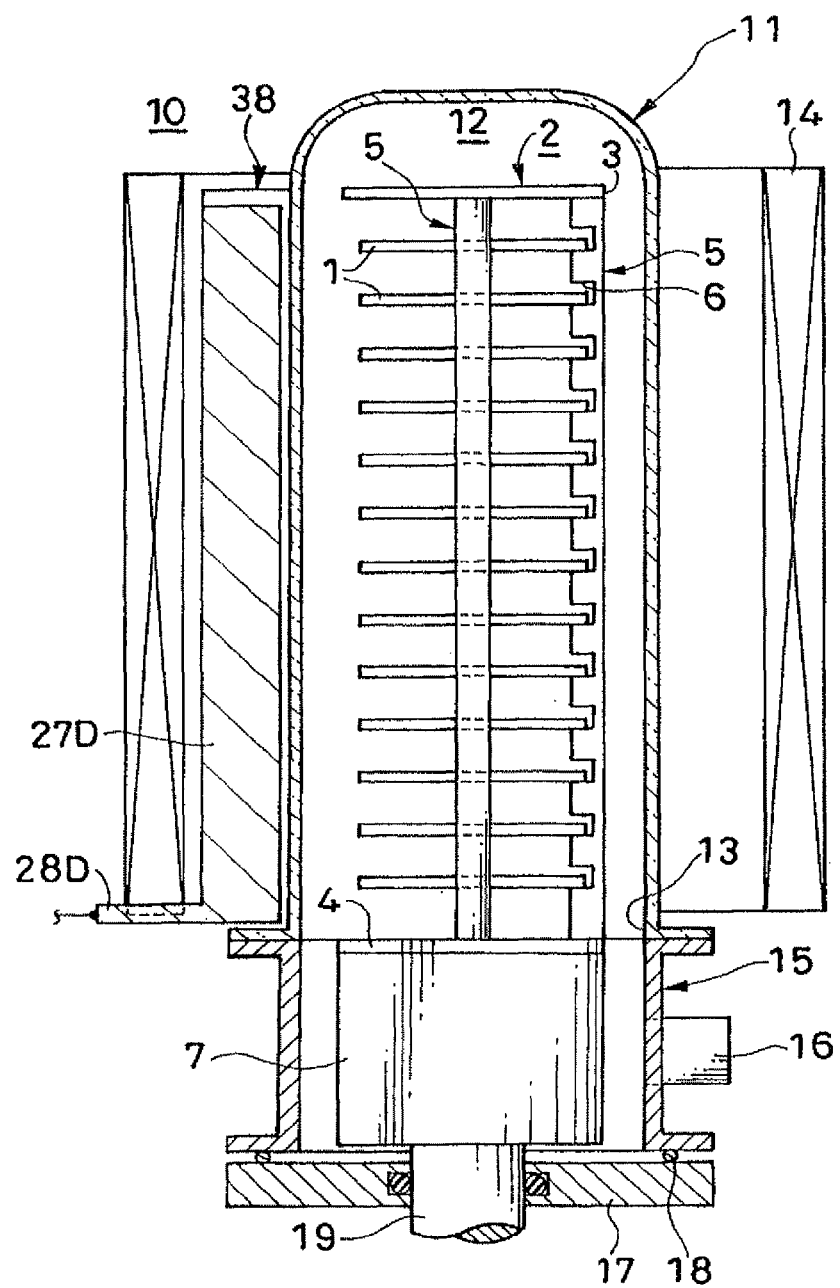
FIG. 15 is a longitudinal sectional view taken along a line XIV-XIV of FIG. 12.

A CVD apparatus of the sixth embodiment of the present invention will be explained with reference to FIGS. 13 to 15.

A CVD apparatus of this embodiment includes a discharge tube 38 forming a plasma chamber 37. The discharge tube 38 is made of dielectric material, and is formed into a substantially triangular prism shape which is shorter than the process tube 11. The discharge tube 38 extends in the vertical direction along a portion of an outer periphery of a sidewall of the process tube 11. A plurality of blowout openings 39 are arranged in the sidewall of the process tube 11 surrounded by the discharge tube 38 such as to be opposed to the space between the upper and lower wafers 1 and 1. The processing gas 41 is supplied from the gas supply pipe 21 to the plasma chamber 37 of the discharge tube 38. A pair of thin and long flat plate-like electrodes 27D and 27D which are shorter than the discharge tube 38 are provided on opposite sides of the discharge tube 38 in its circumferential direction in a state in which the electrodes 27D and 27D are exposed to the atmospheric pressure. The high frequency power source 31 which applies high frequency electricity is electrically connected to connecting portions 28D and 28D respectively formed on the electrodes 27D and 27D through the matching device 32.

After the processing gas 41 is supplied to the plasma chamber 37 by the gas supply pipe 21 and a pressure of the gas is maintained at a predetermined value, if the high frequency electricity is applied between both the electrodes 27D and 27D by the high frequency power source 31 and the matching device 32, plasma 40 is formed in the plasma chamber 37 and the processing gas 41 is activated. The activated particles 42 are emitted from the blowout openings 35C which are in communication with the discharge tube 38 and are supplied to the processing chamber 12, and the particles come into contact with each wafer 1 held by the boat 2. The active particles 42 which came into contact with wafer 1 processes a surface of the wafer 1.

The above-described batch-type remote plasma processing apparatuses according to the preferred embodiments of the present invention are preferably used for a substrate processing method for processing a substrate, a film forming method and a semiconductor device manufacturing method.

The present invention is not limited to the above embodiments and can be variously modified of course.

For example, the number of blowout openings of the gas supplying pipe is not necessarily the same as the number of wafers to be processed, and may be increased or decreased in correspondence with the number of wafers to be processed.

For example, the blowout opening is not necessarily opposed to the space of the upper and lower adjacent wafers, and two or three blowout openings may be disposed between the adjacent wafers.

Although carbon existing on the $Ta_2O_5$ film of the capacitance portion of the capacitor was eliminated in the above embodiment, the batch-type remote plasma processing apparatus of the present invention can also be applied to a case in which a foreign matter existing on another film (molecule, atom or the like on other films) is to be eliminated, a case in which a CVD film is formed on a wafer, a case in which thermal processing is carried out, and the like.

For example, in a processing for nitriding an oxide film for a gate electrode of a DRAM, a surface of the oxide film could be nitrided by supplying nitrogen ($N_2$) gas, ammonia ($NH_3$) gas or nitrogen monoxide ($N_2O$) to a gas supplying pipe, and by heating a processing chamber to a temperature in a range from a room temperature to 750° C. A surface of a silicon wafer before a silicon germanium (SiGe) film was formed was processed by plasma using active particles of hydrogen ($H_2$) gas, a natural oxide film could be eliminated, and a desired SiGe film could be formed. When a nitrogen film was formed at a low temperature, if ALD (atomic layer deposition atomic layer film forming) in which DCS (dichlorosilane) and $NH_3$ (ammonia) were alternately supplied to form Si (silicon) and N (nitrogen) were formed one each, a high quality nitrogen film could be obtained by activating $NH_3$ with plasma and supplying the same when $NH_3$ was supplied.

Although a wafer was processed in the above embodiment, a subject to be processed may be a photomask, a printed wiring substrate, a liquid crystal panel, a compact disk, a magnetic disk or the like.

The entire disclosures of Japanese Patent Application No. 2001-3703 filed on Jan. 11, 2001, Japanese Patent Application No. 2002-3615 filed on Jan. 10, 2002 and Japanese Patent Application No. 2002-203397 filed on Jul. 12, 2002 including specifications, claims, drawings and abstracts are incorporated herein by reference in their entireties.

Although various exemplary embodiments have been shown and described, the invention is not limited to the embodiments shown. Therefore, the scope of the invention is intended to be limited solely by the scope of the claims that follow.

What is claimed is:

1. A method of manufacturing a semiconductor device comprising:
   accommodating a plurality of substrates in a processing chamber provided in a processing tube;
   activating a processing gas in a plasma generating chamber that extends outside of a circumference of the processing tube by applying electricity to an electrode;
   supplying the processing gas from the plasma generating chamber to the processing chamber; and
   removing the processing gas from the processing chamber via a gas exhaust opening formed in the processing tube,
   wherein the electrode is provided outside of the plasma generating chamber.

2. The method of manufacturing a semiconductor device as recited in claim 1, wherein the electrode has a cylindrical shape.

3. The method of manufacturing a semiconductor device as recited in claim 1, wherein a wall with a blowout opening separates the processing chamber and the plasma generating chamber.

4. The method of manufacturing a semiconductor device as recited in claim 1, wherein the gas exhaust opening is opened at the bottom of the processing tube.

5. The method of manufacturing a semiconductor device as recited in claim 1, wherein the gas exhaust opening is opened at the top of the processing tube.

6. A method of manufacturing a semiconductor device comprising:
   accommodating a plurality of substrates in a processing chamber provided in a processing tube;
   activating a processing gas in a plasma generating chamber that extends outside of a circumference of the processing tube by applying electricity to an electrode;
   supplying the processing gas from the plasma generating chamber to the processing chamber; and
   removing the processing gas from the processing chamber via a gas exhaust opening formed in the processing tube,
   wherein the electrode has a flat plate-like shape.

7. The method of manufacturing a semiconductor device as recited in claim 6, wherein a wall with a blowout opening separates the processing chamber and the plasma generating chamber.

8. The method of manufacturing a semiconductor device as recited in claim 6, wherein the gas exhaust opening is opened at the bottom of the processing tube.

9. A method of manufacturing a semiconductor device comprising:
   accommodating a plurality of substrates in a processing chamber provided in a processing tube;
   activating a processing gas in a plasma generating chamber in communication with the processing chamber by applying electricity to an electrode that is provided outside of the plasma generating chamber;
   supplying the processing gas to the processing chamber; and
   removing the processing gas from the processing chamber via a gas exhaust opening formed in the processing tube.

10. The method of manufacturing a semiconductor device according to claim 9, wherein the electrode has a flat plate-like shape.

11. The method of manufacturing a semiconductor device according to claim 10, wherein the plasma generating chamber extends outside of a circumference of the processing tube.

12. The method of manufacturing a semiconductor device according to claim 11, wherein a wall with a blowout opening separates the processing chamber and the plasma generating chamber.

13. The method of manufacturing a semiconductor device according to claim 9, wherein no wall separates the plasma generating chamber and the processing chamber.

14. The method of manufacturing a semiconductor device according to claim 13, wherein the electrode has a flat plate-like shape.

15. The method of manufacturing a semiconductor device according to claim 14, wherein another electrode having a cylindrical shape is provided inside of the plasma generating chamber.

16. The method of manufacturing a semiconductor device according to claim 10, wherein the plasma generating chamber is formed inside of a circumference of the processing tube.

17. The method of manufacturing a semiconductor device according to claim 9, wherein the gas exhaust opening is opened at the bottom of the processing tube.

18. The method of manufacturing a semiconductor device according to claim 9, wherein the gas exhaust opening is opened at the top of the processing tube.

* * * * *